United States Patent
Glenn

(10) Patent No.: US 6,415,505 B1
(45) Date of Patent: Jul. 9, 2002

(54) MICROMACHINE PACKAGE FABRICATION METHOD

(75) Inventor: Thomas P. Glenn, Gilbert, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/440,808

(22) Filed: Nov. 15, 1999

(51) Int. Cl.[7] ............................................. H01K 3/10
(52) U.S. Cl. ......................... 29/852; 29/825; 29/829; 29/840
(58) Field of Search .................. 29/825, 829, 840, 29/841, 599, 741, 740, 852

(56) References Cited

U.S. PATENT DOCUMENTS

| | | | |
|---|---|---|---|
| 4,040,078 A | * 8/1977 | Eckton, Jr. et al. | 29/599 |
| 4,217,684 A | * 8/1980 | Brisken et al. | 29/841 |
| 4,936,808 A | 6/1990 | Lee | |
| 5,270,262 A | * 12/1993 | Switky et al. | |
| 5,414,300 A | 5/1995 | Tozawa et al. | 257/704 |
| 5,597,767 A | 1/1997 | Mignardi et al. | 437/227 |
| 5,719,069 A | 2/1998 | Sparks | |
| 5,732,465 A | * 3/1998 | Tokita et al. | 29/841 |
| 5,742,007 A | 4/1998 | Kornowski et al. | 174/52.3 |
| 5,860,210 A | 1/1999 | Hawkins | 29/830 |
| 5,977,613 A | * 11/1999 | Takata et al. | |
| 6,074,891 A | 6/2000 | Staller | 438/53 |
| 6,140,144 A | 10/2000 | Najafi et al. | 438/53 |
| 6,226,187 B1 | * 5/2001 | Questad et al. | 29/841 |
| 6,323,550 B1 | 11/2001 | Martin et al. | 257/704 |

FOREIGN PATENT DOCUMENTS

| | | |
|---|---|---|
| EP | 0 828 346 A2 | 3/1998 |
| GB | 2 100 521 A | 12/1982 |
| WO | WO 99/ 50913 | 10/1999 |

* cited by examiner

Primary Examiner—Carl J. Arbes
(74) Attorney, Agent, or Firm—Gunnison, McKay & Hodgson, L.L.P.; Serge J. Hodgson

(57) ABSTRACT

Micromachine chips are tested for validity while the micromachine chips are still in wafer form. Any defective micromachine chips are marked or otherwise identified. Coupons are attached to the micromachine chips. The coupons are attached only to the micromachine chips which have been tested and found to be good. In this manner, waste of coupons is avoided and labor associated with attaching the coupons to defective micromachine chips is saved.

24 Claims, 4 Drawing Sheets

MICROMACHINE PACKAGE FABRICATION METHOD

FIELD OF THE INVENTION

The present invention relates generally to the packaging of electronic components. More particularly, the present invention relates to a method of fabricating a micromachine package.

BACKGROUND OF THE INVENTION

Micromachine sensing elements (hereinafter micromachines) are well known. A micromachine includes a miniature moveable structure, such as a bridge, cantilevered beam, suspended mass, membrane or capacitive element, which is supported over a cavity formed in a silicon wafer. Since the operation of the micromachine depends upon the moveability of the miniature moveable structure, it is critical that the package, which includes the micromachine, does not contact the miniature moveable structure in any manner.

FIG. 1 is a cross-sectional view of a structure 8 during the formation of a plurality of micromachine packages in accordance with the prior art. As shown in FIG. 1, a silicon wafer 10 includes a plurality of micromachine chips 12. Micromachine chips 12 include micromachine areas 14 formed in an upper surface 10U of wafer 10. Micromachine areas 14 include the miniature moveable structure of the micromachine. Micromachine chips 12 further include bond pads 16 on upper surface 10U of wafer 10. Bond pads 16 are connected to the internal circuitry of micromachine chips 12.

Micromachine chips 12 are integrally connected together in an array format. Each of micromachine chips 12 is delineated by a singulation street 20 which is located between adjacent micromachine chips 12.

A silicon lid 30 formed from a silicon wafer is positioned above wafer 10. Lid 30 includes a plurality of caps 42 integrally connected to one another. Each cap 42 includes a micromachine cavity 32. Each micromachine cavity 32 is positioned over a corresponding micromachine area 14. Generally, micromachine cavities 32 are wider than micromachine areas 14.

Each cap 42 further includes a bond pad cavity 34. Each bond pad cavity 34 is positioned over a corresponding set of bond pads 16 on a micromachine chip 12. Generally, bond pad cavities 34 are wider than bond pads 16, and are at least as deep as bond pads 16 are tall.

FIG. 2A is a cross-sectional view of structure 8 of FIG. 1 at a further stage in fabrication in accordance with the prior art. As shown in FIG. 2A, lid 30 is attached to wafer 10. Micromachine cavities 32 are positioned above corresponding micromachine areas 14. Further, bond pad cavities 34 are positioned above corresponding sets of bond pads 16.

FIG. 2B is a cross-sectional view of structure 8 of FIG. 2A at a further stage of fabrication in accordance with the prior art. Referring to FIG. 2B, a series of shallow cuts are made to remove a portion of each cap 42 to expose bond pads 16. Micromachine chips 12 are electrically tested by connecting test probes to bond pads 16. Should testing of a micromachine chip 12 indicate that the micromachine chip 12 is defective, the micromachine chip 12 and/or corresponding cap 42 is marked. For example, micromachine chip 12A is marked as being defective. Wafer 10 is then singulated along singulation streets 20. Micromachine chips 12 which are marked as defective are discarded.

Disadvantageously, a cap 42 is attached to a micromachine chip 12 even if the micromachine chip 12 is defective. The cap 42 and defective micromachine chip 12 are discarded. However, since a cap 42 is attached to the defective micromachine chip 12, the cost associated with the defective micromachine chip 12 is increased compared to the cost associated with the defective micromachine chip 12 alone. This increase is the cost of fabricating each batch of micromachine packages. This, in turn, increases the cost of fabricating each individual micromachine package which passes testing.

After singulation of wafer 10, each good micromachine chip 12 with cap 42 is further package FIG. 3 is a cross-sectional view of a single micromachine package 40 in accordance with the prior art. As shown in FIG. 3, micromachine chip 12 and cap 42 are attached to a substrate 52. Bond pads 16 are electrically connected to traces 44 by bond wires 46. To prevent accumulation of static charge on cap 42 which would render micromachine chip 12 inoperable, cap 42 is electrically connected to a ground trace 48 by a bond wire 50. Ground trace 48 is grounded during use. Although effective at prevent accumulation of static charge on cap 42, grounding cap 42 by electrically connecting cap 42 to ground through bond wire 50 and ground trace 48 is relatively labor intensive and complex which increases the cost of fabricating package 40.

SUMMARY OF THE INVENTION

In accordance with the present invention, a micromachine package includes a micromachine chip having a micromachine area in an upper surface of the micromachine chip. A bead attached to the upper surface of the micromachine chip and a coupon attached to the bead form an enclosure. The enclosure defines a cavity, i.e., a free space, above the micromachine area. The cavity allows a moveable structure of the micromachine area to freely move.

Of importance, of importance, the coupon has an area substantially less than an area of the upper surface of the micromachine chip. More particularly, the coupon is sized to extend only slightly beyond the micromachine area. In this manner, the amount of material used for the coupon is minimized. By minimizing the amount of material used for the coupon, the costs associated with the micromachine package are also minimized.

Recall that in the prior art, a single lid was attached to a plurality of micromachine chips while still in wafer form. Thus, in the prior art, the cap which covered the micromachine area had an area before trimming equal to the area of the upper surface of the micromachine chip. Accordingly, more material was used for the cap of the prior art than for the coupon in accordance with the present invention. As a result, the micromachine package in accordance with the present invention is fabricated at a lower cost than the micromachine package of the prior art.

To further reduce the costs associated with each micromachine package, in one embodiment, a plurality of coupons are attached to a plurality of micromachine chips while the micromachine chips are still in wafer form. Of importance, the plurality of micromachine chips are tested for validity (i.e., to determine whether each micromachine chip is good or defective) before the coupons are attached and while the plurality of micromachine chips are integrally connected to one another. Any defective micromachine chips are marked or otherwise identified.

Advantageously, the coupons are attached only to the micromachine chips which have been tested and found to be good. The coupons are not attached to defective micromachine chips. In this manner, waste of coupons is avoided and labor associated with attaching the coupons to defective micromachine chips is saved. This, in turn, minimizes the cost associated with the fabrication of each batch of micromachine packages and, more particularly, with each micromachine package.

Recall that in the prior art, a single lid was attached to a plurality of micromachine chips while still in wafer form. Thus, in the prior art, a cap was attached to each micromachine chip even if the micromachine chip was defective. Accordingly, the caps and labor associated with attaching the caps to the defective micromachine chips were wasted in the prior art. As a result, a micromachine package in accordance with the present invention is less expensive to manufacture than a micromachine package of the prior art.

In one embodiment, a method includes attaching a bead to an inner surface of a coupon. The method further includes attaching the bead to an upper surface of a micromachine chip. The bead and the coupon form an enclosure which defines a cavity above a micromachine area in the upper surface of the micromachine chip.

A lower surface of the micromachine chip is attached to an upper surface of a substrate such as a printed circuit board. Formed on the upper surface of the substrate are a plurality of electrically conductive traces. The bond pads of the micromachine chip are electrically connected to these traces by a plurality of bond wires.

In one embodiment, the coupon is ceramic. In accordance with this embodiment, the coupon is not electrically connected to ground, i.e., is electrically floating. Of importance, by forming the coupon of ceramic, the coupon does not accumulate static charge. Accordingly, the prior art requirement of grounding the cap which covered the micromachine area is eliminated. Thus, fabrication of a micromachine package in accordance with the present invention is less labor intensive, less complex and, consequently, less expensive than fabrication of a micromachine package in accordance with the prior art.

In one embodiment, the micromachine package further includes a package body formed around the micromachine chip, the bead and the coupon. Advantageously, the package body is formed at a relatively low cost using a plastic encapsulation process. More particularly, to form the package body, the micromachine chip, the bead, and the coupon are molded in a plastic encapsulant which is injected. Of importance, the enclosure formed by the coupon and the bead has sufficient structural integrity, e.g., strength, to withstand this injection of plastic encapsulant.

In contrast, a micromachine package of the prior art used a cap formed of silicon from a silicon wafer. Disadvantageously, the silicon cap lacked the structural integrity to withstand the injection of plastic encapsulant which occurs during a plastic encapsulation process. Stated another way, the silicon cap would have a tendency to crack if the silicon cap was encapsulated in a plastic encapsulant. Accordingly, if a prior art micromachine package was plastic encapsulated, an unacceptably high incidence of package failure would be observed.

Advantageously, the micromachine package in accordance with this embodiment is a plastic encapsulated package. Accordingly, the micromachine package has superior performance, e.g., resistance to shorting and environmental degradation, than a prior art micromachine package. Further, since the micromachine package is fabricated using a plastic encapsulation process, this superior performance is obtained at a relatively low cost.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
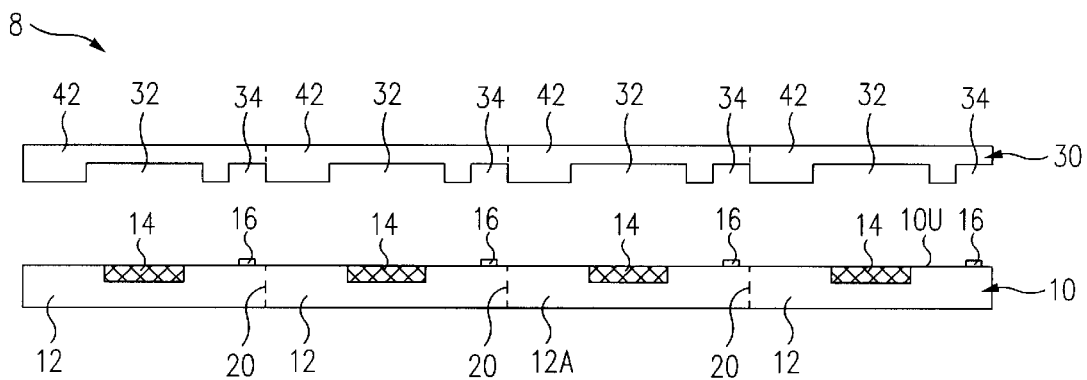
FIG. 1 is a cross-sectional view of a structure during the formation of a plurality of micromachine packages in accordance with the prior art.

In accordance with the present invention, a micromachine package 400 (FIGS. 4, 5) includes a micromachine chip 412 having a micromachine area 414 in an upper surface 412U of micromachine chip 412. A bead 450 attached to upper surface 412U of micromachine chip 412 and a coupon 452 attached to bead 450 form an enclosure. The enclosure defines a cavity 454, i.e., a free space, above micromachine area 414. Cavity 454 allows a moveable structure of micromachine area 414 to freely move.

Of importance, coupon 452 has an area substantially less than an area of upper surface 412U of micromachine chip 412. More particularly, coupon 452 is sized to extend only slightly beyond micromachine area 414. In this manner, the amount of material used for coupon 452 is minimized. By minimizing the amount of material used for coupon 452, the costs associated with micromachine package 400 are also minimized.

Figure 2A:
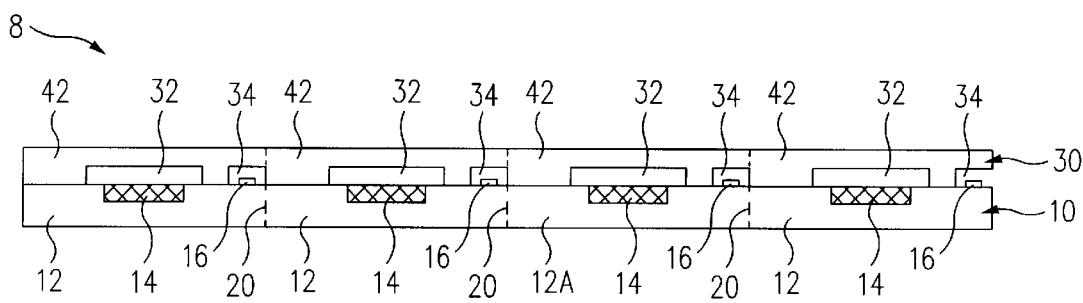
FIG. 2A is a cross-sectional view of the structure of FIG. 1 at a further stage in fabrication in accordance with the prior art.
Figure 2B:
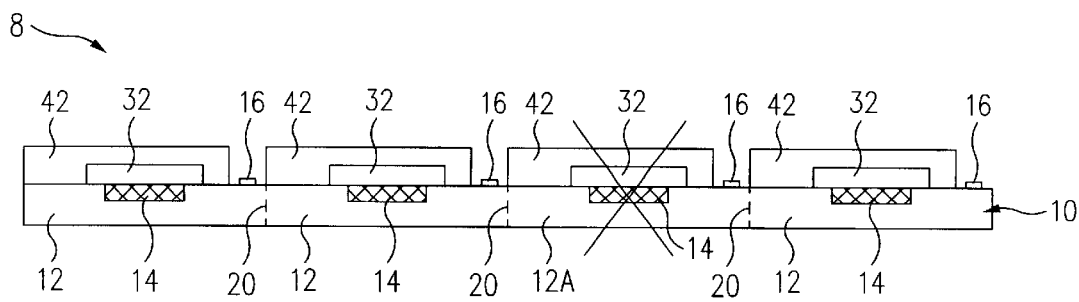
FIG. 2B is a cross-sectional view of the structure of FIG. 2A at a further stage in fabrication in accordance with the prior art.

Recall that in the prior art, a single lid 30 was attached to a plurality of micromachine chips 12 while still in wafer form (FIGS. 1, 2A). Thus, in the prior art, cap 42 which covered micromachine area 14 had an area before trimming equal to the area of the upper surface of micromachine chip 12. Accordingly, more material was used for cap 42 of the prior art than for coupon 452 in accordance with the present invention. As a result, micromachine package 400 in accordance with the present invention is fabricated at a lower cost than a micromachine package of the prior art.

To further reduce the costs associated with each micromachine package 400, in one embodiment (FIGS. 6, 7), a plurality of coupons 452 are attached to a plurality of micromachine chips 412 while micromachine chips 412 are still in wafer form. Of importance, the plurality of micromachine chips 412 are tested for validity (i.e., to determine whether each micromachine chip 412 is good or defective) before coupons 452 are attached and while the plurality of micromachine chips 412 are integrally connected to one another. Any defective micromachine chip 412, for example micromachine chip 412C, is marked or otherwise identified.

Advantageously, coupons 452 are attached only to micromachine chips 412 which have been tested and found to be good. Coupons 452 are not attached to defective micromachine chips 412. In this manner, waste of coupons 452 is avoided and labor associated with attaching coupons 452 to defective micromachine chips 412 is saved. This, in turn, minimizes the cost associated with the fabrication of each batch of micromachine packages 400 and, more particularly, with each micromachine package 400.

Recall that in the prior art, a single lid 30 was attached a plurality of micromachine chips 12 while still in wafer form (FIGS. 1, 2A). Thus, in the prior art, a cap 42 was attached to each micromachine chip 12 even if the micromachine chip was defective. Accordingly, caps 42 and labor associated with attaching caps 42 to the defective micromachine chips 12 were wasted in the prior art. As a result, micromachine package 400 in accordance with the present invention is less expensive to manufacture than a micromachine package of the prior art.

In one embodiment (FIG. 8), a lower surface 412L of micromachine chip 412 is attached to an upper surface 802U of a substrate 802 such as a printed circuit board. Formed on upper surface 802U of substrate 802 are a plurality of electrically conductive traces including trace 804. Bond pads 416 of micromachine chip 412 are electrically connected to these traces by a plurality of bond wires including bond wire 806.

In one embodiment, coupon 452 is ceramic. In accordance with this embodiment, coupon 452 is not electrically connected to ground, i.e., is electrically floating. Of importance, by forming coupon 452 of ceramic, coupon 452 does not accumulate static charge. Accordingly, the prior art requirement of grounding cap 42 (FIG. 3) which covered micromachine area 14 is eliminated. Thus, fabrication of micromachine package 800 (FIG. 8) in accordance with the present invention is less labor intensive, less complex and, consequently, less expensive than fabrication of micromachine package 40 in accordance with the prior art.

In one embodiment, micromachine package 800 (FIG. 8) further includes a package body 814 formed around micromachine chip 412, bead 450 and coupon 452. Advantageously, package body 814 is formed at a relatively low cost using a plastic encapsulation process. More particularly, to form package body 814, micromachine chip 412, bead 450, and coupon 452 are molded in a plastic encapsulant which is injected. Of importance, the enclosure formed by coupon 452 and bead 450 has sufficient structural integrity, e.g., strength, to withstand this injection of plastic encapsulant.

In contrast, micromachine package 40 (FIG. 3) of the prior art used cap 42 formed of silicon from a silicon wafer. Disadvantageously, cap 42 lacked the structural integrity to withstand the injection of plastic encapsulant which occurs during a plastic encapsulation process. Stated another way, cap 42 would have a tendency to crack if cap 42 was encapsulated in a plastic encapsulant. Accordingly, if micromachine package 40 was plastic encapsulated, an unacceptably high incidence of package failure would be observed.

Figure 3:
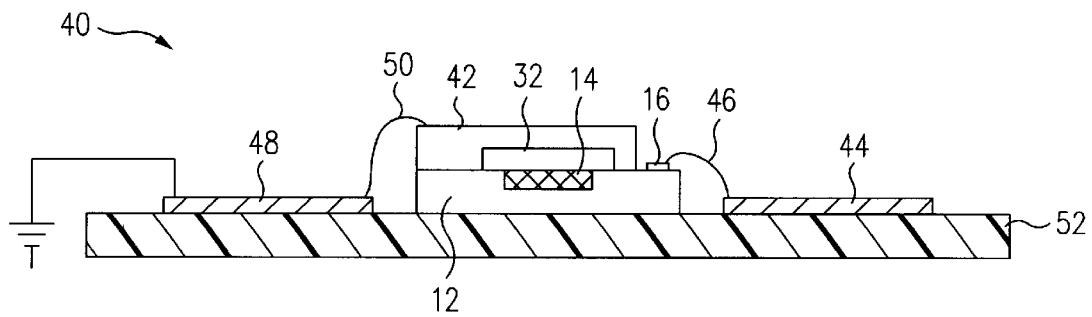
FIG. 3 is a cross-sectional view of a single micromachine package in accordance with the prior art.

Advantageously, micromachine package 800 (FIG. 8) in accordance with this embodiment is a plastic encapsulated package. Accordingly, micromachine package 800 has superior performance, e.g., resistance to shorting and environmental degradation, than micromachine package 40 (FIG. 3). Further, since micromachine package 800 is fabricated using a plastic encapsulation process, this superior performance is obtained at a relatively low cost.

Figure 4:
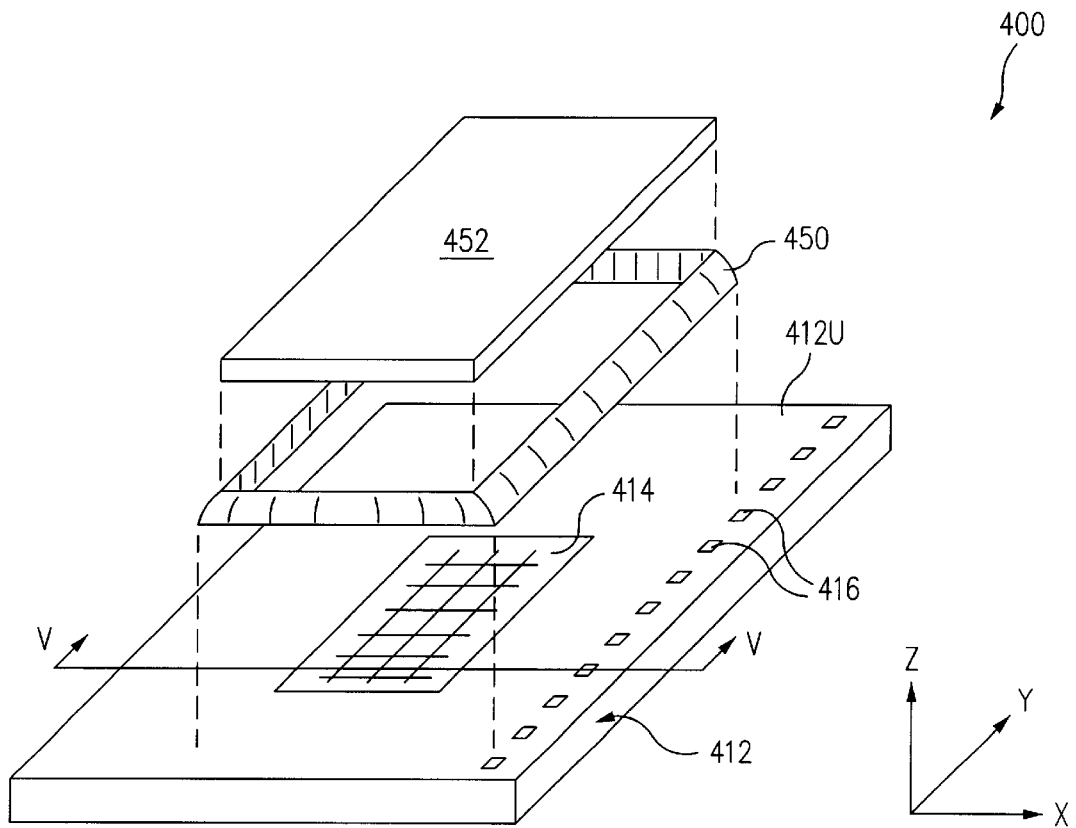
FIG. 4 is an exploded perspective view of a micromachine package in accordance with the present invention.
Figure 5:
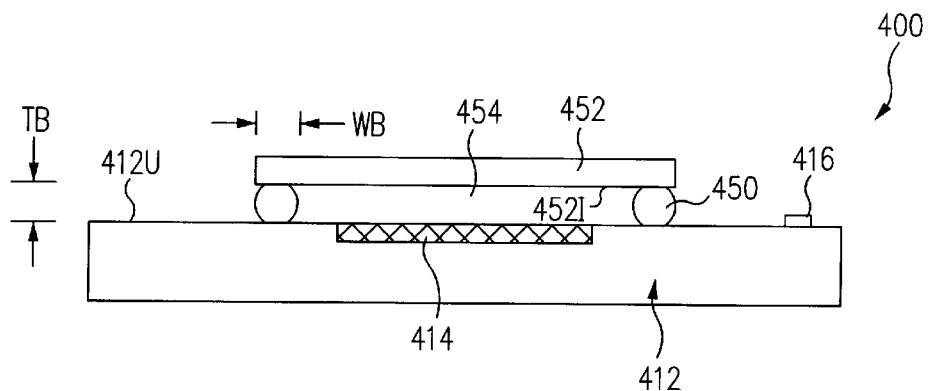
FIG. 5 is a cross-sectional view of the micromachine package along the line V—V of FIG. 4.

More particularly, FIG. 4 is an exploded perspective view of a micromachine package 400 in accordance with the present invention. FIG. 5 is a cross-sectional view of micromachine package 400 along the line V—V of FIG. 4. Referring to FIGS. 4 and 5 together, micromachine package 400 includes a micromachine chip 412. Micromachine chip 412 includes a micromachine area 414 in an upper, e.g., first, surface 412U of micromachine chip 412. Micromachine area 414 includes a miniature moveable structure, such as a bridge, cantilevered beam, suspended mass, membrane or capacitive element, which is supported over a cavity as is well known to those of skill in the art.

Also formed on upper surface 412U of micromachine chip 412 are a plurality of bond pads 416. Bond pads 416 are connected to the internal circuitry of micromachine chip 412. In one embodiment, twelve bond pads 416 are used, although in other embodiments, more or less than twelve bond pads 416 are used.

Attached, i.e., secured, to upper surface 412U of micromachine chip 412 is a bead 450. Bead 450 defines an area of upper surface 412U which includes micromachine area 414. More particularly, bead 450 surrounds micromachine area 414 around a perimeter of micromachine area 414 yet does not extend into micromachine area 414. Further, bead 450 does not encompass and leaves exposed bond pads 416.

In one embodiment, bead 450 is solder glass, for example, is a lead-based compound such as IWAKI IWAKT-T-187, Kyocera KC-IM, or Kyocera KC-402. In another embodiment, bead 450 is an epoxy, for example, is Hysol 4451.

Bead 450 has a width WB in a direction parallel to upper surface 412U (i.e., in the X-Y plane) in the range of approximately 0.002 to 0.005 inches (0.051 to 0.127 millimeters). Bead 450 has a thickness TB in a direction perpendicular to upper surface 412U (i.e., along the Z axis) in the range of approximately 0.003 to 0.006 inches (0.076 to 0.152 millimeters) and, in one particular embodiment, of 0.003 inches (0.076 millimeters).

Bead 450 attaches, i.e., secures, a coupon 452 to upper surface 412U. In particular, bead 450 is attached to the perimeter of an inner, e.g., first, surface 452I of coupon 452. Coupon 452 is substantially parallel to upper surface 412U and is spaced apart from upper surface 412U by bead 450. Coupon 452 is located directly above micromachine area 414 and has a greater width along the x-axis and a greater length along the y-axis than micromachine area 414.

Of importance, coupon 452 has an area in the x-y plane which is substantially less than the area of upper surface 412U of micromachine chip 412. More particularly, coupon 452 is sized to extend only slightly beyond micromachine area 414. In this manner, the amount of material used for coupon 452 is minimized. By minimizing the amount of material used for coupon 452, the costs associated with micromachine package 400 are also minimized.

Recall that in the prior art, a single lid 30 was attached to a plurality of micromachine chips 12 while still in wafer form (see FIGS. 1 and 2A). Thus, in the prior art, cap 42 had an area (before trimming) equal to an area of the upper surface of micromachine chip 12. Accordingly, more material was used for cap 42 of the prior art than coupon 452 in accordance with present invention. As a result, micromachine package 400 in accordance with present invention is fabricated at a lower cost than a micromachine package of the prior art.

In one embodiment, coupon 452 is greater in width along the x-axis than micromachine area 414 by approximately 0.080 to 0.150 inches (2.032 to 3.810 millimeters). Similarly, coupon 452 is greater in width along the y-axis than micromachine area 414 by approximately 0.080 to 0.150 inches (2.032 to 3.810 millimeters). Coupon 452 has a thickness along the z-axis in the approximate range of 0.010 to 0.040 inches (0.254 to 1.016 millimeters), and in one embodiment, of 0.020 inches (0.51 millimeters).

In this embodiment, coupon 452 is ceramic. However, other materials which have a thermal coefficient of expansion similar to the thermal coefficient of expansion of micromachine chip 412 are used in other embodiments.

Bead 450 and coupon 452 form an enclosure which defines a cavity 454, i.e., a free space, above micromachine area 414. Cavity 454 allows the moveable structure of micromachine area 414 to freely move. To insure space 454 is adequate to allow free movement of the moveable structure of micromachine area 414, it is important that coupon 452 is flat. For example, the maximum allowable deviation from a hypothetical mean plane generally parallel to inner surface 452I of coupon 452 is 0.004 inches over 2.0 inches of inner surface 452I scaled to the actual size of inner surface 452I. Although coupon 452 is described as flat, in light of this disclosure, is understood that generally coupon 452 has any shape which prevents coupon 452 from extending downwards towards micromachine area 414. Further, to seal micromachine area 414, it is important that both bead 450 and coupon 452 are substantially impervious to moisture.

To further reduce the costs associated with each micromachine package 400, in one embodiment, a plurality of coupons 452 are attached to a plurality of micromachine chips 412 while micromachine chips 412 are integrally connected together, e.g., while still in wafer form.

Figure 6:
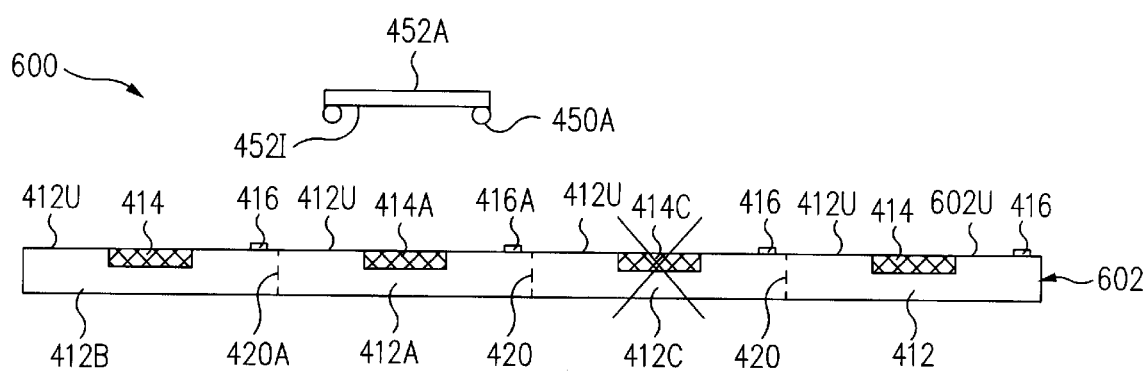
FIG. 6 is a cross-sectional view of a structure during the formation of a plurality of micromachine packages in accordance with the present invention.

FIG. 6 is a cross-sectional view of a structure 600 during the formation of a plurality of micromachine packages 400 in accordance with the present invention. As shown in FIG. 6, a micromachine substrate 602, e.g., a silicon wafer, includes a plurality of micromachine chips 412 integrally connected to one another. Micromachine chips 412 include micromachine areas 414 formed in an upper, e.g. first, surface 602U of micromachine substrate 602. Micromachine areas 414 include the miniature moveable structures of the micromachines. Micromachine chips 412 further include bond pads 416 on upper surface 602U of micromachine substrate 602. Bond pads 416 are connected to the internal circuitry of micromachine chips 412.

To illustrate, a first micromachine chip 412A of the plurality of micromachine chips 412 includes a first micromachine area 414A of the plurality of micromachine areas 414. Micromachine chip 412A also includes a first bond pad 416A of the plurality of bond pads 416. The other micromachine chips 412 include micromachine areas 414 and bond pads 416 in a similar manner.

Micromachine chips 412 are integrally connected together in an array format. Each of micromachine chips 412 is delineated by a singulation street 420 which is located between adjacent micromachine chips 412. For example, a first singulation street 420A of the plurality of singulation streets 420 of micromachine substrate 602 delineates first micromachine chip 412A from a second micromachine chip 412B of the plurality of micromachine chips 412. The other micromachine chips 412 are similarly delineated from adjacent micromachine chips 412 by corresponding singulation streets 420.

Of importance, micromachine chips 412 are tested for validity, i.e., to determine whether each micromachine chip 412 is good or defective, before coupons 452 are attached to micromachine substrate 602 and while micromachine chips 412 are integrally attached to one another. Any defective micromachine chips 412 are marked or otherwise identified. For example, micromachine chip 412C is identified as being defective.

As shown in FIG. 6, a bead 450A is attached to a perimeter of an inner surface 452I of a coupon 452A. In one embodiment, coupon 452A is ceramic, e.g., aluminum nitride, manufactured by a dry press or high-temperature multi-layer process as is well known to those of skill in the art. In alternative embodiments, coupon 452A is a low-temperature co-fired ceramic as is also well known to those of skill in the art.

In one embodiment, bead 450A is solder glass. In accordance with this embodiment, bead 450A is attached to inner surface 452I using any one of a number of methods well known to those of skill in the art such as by screening. For example, a two inch by two inch square single piece of ceramic includes a plurality of coupons 452 integrally connected together. The material of beads 450 is screened onto a surface of the piece of ceramic. The piece of ceramic is singulated, e.g., by sawing, to form a plurality of coupons 452 having beads 450 attached, including coupon 452A having bead 450A attached. As another example, bead 450A is screened directly to an individual coupon 452A.

After bead 450A is applied to coupon 452A, coupon 452A is positioned above first micromachine chip 412A. Micromachine substrate 602 and coupon 452A are heated. In one embodiment, micromachine substrate 602 is heated to within the approximate range of 100° C. to 300° C. and coupon 452A is heated to within the approximate range of 400° C. to 420° C. In one particular embodiment, micromachine substrate 602 is heated to 300° C. and coupon 452A is heated to 420° C. Heating of coupon 452A causes bead 450A to melt.

A hot cap sealer, which is well known to those of skill in the art, places coupon 452A over micromachine area 414A such that melted bead 450A contacts upper surface 602U of micromachine substrate 602 around a perimeter of micromachine area 414A. Bead 450A cools, solidifies and attaches to upper surface 412U of micromachine chip 412A thus securing coupon 452A to micromachine chip 412A. The other coupons 452 are attached to the other good micromachine chips 412 in a manner similar to the attachment of coupon 452A to micromachine chip 412A. Micromachine substrate 602 is continuously heated while the other coupons 452 are attached to the other good micromachine chips 412.

In another embodiment, bead 450A is epoxy, e.g., is Hysol 4451. In accordance with this embodiment, bead 450A is attached to inner surface 452I using any one of a number of methods well known to those of skill in the art such as by screening or writing. For example, epoxy is screened directly on an individual coupon 452A to form bead 450A. Alternatively, epoxy is written directly on an individual coupon 452A to form bead 450A. To illustrate, a needle dispenser, which is well known to those of skill in the art, writes (i.e. dispenses) epoxy directly on an individual coupon 452A to form bead 450A. Suitable needle dispensers are available from Camalot, Inc. of Boston, Mass. and MRSI Inc. of Chelmsford, Mass., e.g., a MRSI 375 dispenser.

After bead 450A is applied to coupon 452A, coupon 452A is positioned above first micromachine chip 412A. A pick and place machine, which is well known to those of skill in the art, places coupon 452A over micromachine area 414A such that bead 450A contacts upper surface 602U of micromachine substrate 602 around a perimeter of micromachine area 414A.

Alternatively, bead 450A is applied directly on upper surface 602U of micromachine substrate 602 around a perimeter of micromachine area 414A, e.g., by screening or writing epoxy on upper surface 602U of micromachine substrate 602. After bead 450A is applied, a pick and place machine places coupon 452A over micromachine area 414A such that inner surface 452I of coupon 452A contacts bead 450A.

The other coupons 452 are similarly attached to the other good micromachine chips 412 in a manner similar to the attachment of coupon 452A to micromachine chip 412A. After all coupons 452 are placed on upper surface 602U of micromachine substrate 602, beads 450 are cured, e.g., by heating. In one embodiment, structure 600 is heated to 80° C. for 30 minutes and then heated to 150° C. for one hour to two hours.

Figure 7:
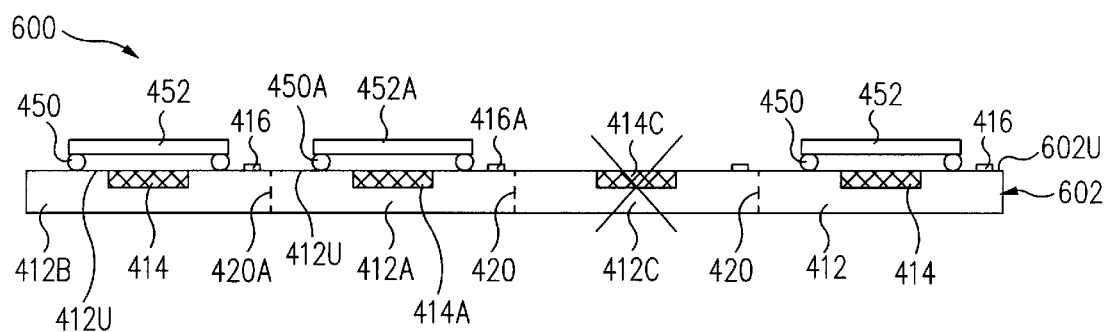
FIG. 7 is a cross-sectional view of the structure of FIG. 6 at a later stage of fabrication in accordance with present invention.

FIG. 7 is a cross-sectional view of structure 600 at a later stage of fabrication in accordance with present invention. As shown in FIG. 7, coupons 452 are attached to micromachine chips 412 which have passed validity testing, i.e., which are good. Advantageously, coupons 452 are attached only to micromachine chips 412 which have been tested and found to be good. Coupons 452 are not attached to defective micromachine chips 412. For example, a coupon 452 is not attached to defective micromachine chip 412C and micromachine area 414C of micromachine chip 412C is left uncovered. In this manner, waste of coupons 452 is avoided and labor associated with attaching coupons 452 to defective micromachine chips 412 is saved. This, in turn, minimizes the cost associated with the fabrication of each batch of micromachine packages 400 and, more particularly, with each micromachine package 400.

Recall that in the prior art, a single lid 30 was attached to a plurality of micromachine chips 12 while still in wafer form (see FIGS. 1 and 2A). Thus, in the prior art, a cap 42 was attached to each micromachine chip 12 even if the micromachine chip 12 was defective. Accordingly, caps 42 and labor associated with attaching caps 42 to defective micromachine chips 12 were wasted in the prior art. As a result, micromachine package 400 in accordance with present invention is less expensive to manufacture than a micromachine package of the prior art.

Referring again to FIG. 7, after coupons 452 are attached to micromachine substrate 602, structure 600 is heated to anneal and release any built-up stress in structure 600 including coupons 452, beads 450 and micromachine substrate 602. In one embodiment, structure 600 is heated to within the approximate range of 425° C. to 435° C. for approximately 2 to 4 minutes.

Micromachine substrate 602 is then singulated along singulation streets 420 resulting in a plurality of micromachine packages 400 (see FIGS. 4, 5). Although the fabrication of a plurality of micromachine packages 400 simultaneously is described above, in light of this disclosure, those of skill in the art will understand that similar techniques are used to fabricate each micromachine package 400 on an individual basis, if desired.

Referring again to FIGS. 4 and 5 together, micromachine package 400 is then attached to a larger substrate such as a printed circuit mother board using methods well known to those skilled the art. Alternatively, micromachine package 400 is further packaged, for example into a ball grid array (BGA) package, as discussed in greater detail below with respect to FIG. 8. Of importance, coupon 452 in combination with bead 450 seals and protects micromachine area 414 from the ambient environment as well as from any plastic encapsulant used to further package micromachine package 400.

Figure 8:
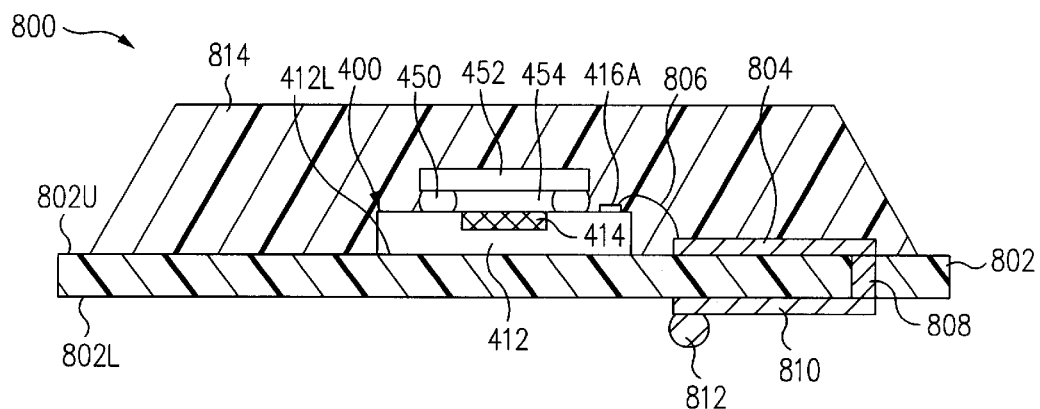
FIG. 8 is a cross-sectional view of a ball grid array micromachine package in accordance with the present invention.

FIG. 8 is a cross-sectional view of a ball grid array micromachine package 800 in accordance with one embodiment of the present invention. Referring to FIG. 8, package 800 includes a substrate 802 such as a printed circuit board. Attached to an upper, e.g., first, surface 802U of substrate 802 is micromachine package 400.

In this embodiment, a lower surface 412L, e.g. a second surface opposite the first surface, of micromachine chip 412 is attached to upper surface 802U of substrate 802, for example, with adhesive.

Formed on upper surface 802U of substrate 802 are a plurality of electrically conductive traces which include a first trace 804. Bond pads 416 are electrically connected to these traces by a plurality of bond wires which include a first bond wire 806. The traces formed on upper surface 802U of substrate 802 are electrically connected to a plurality of electrically conductive vias which include a first via 808. The vias extend from upper surface 802U to a lower, e.g., second, surface 802L of substrate 802. The vias are electrically connected to a plurality of electrically conductive traces formed on lower surface 802L of substrate 802 which include a first trace 810. A plurality of electrically conductive interconnection balls which include interconnection ball 812 are formed on the traces which are formed on lower surface 802L of substrate 802. The interconnection balls, e.g. solder balls, are used to electrically connect package 800 to a larger substrate (not shown) such as a printed circuit mother board.

To illustrate, a first bond pad 416A of the plurality of bond pads 416 is electrically connected to first trace 804 of the plurality of traces on upper surface 802U by first bond wire 806 of the plurality of bond wires. Trace 804 is electrically connected to first via 808 of the plurality of vias. Via 808 is electrically connected to first trace 810 of the plurality of traces on lower surface 802L. Formed on trace 810 is first interconnection ball 812 of the plurality of interconnection balls.

As set forth above, an electrically conductive pathway between bond pad 416A and interconnection ball 812 is formed by bond wire 806, trace 804, via 808 and trace 810. The other bond pads 416, bond wires, traces on upper surface 802U, vias, traces on lower surface 802L and interconnection balls 812 are electrically connected to one another in a similar fashion so are not discussed further to avoid detracting from the principals of the invention.

Although a particular electrically conductive pathway between interconnection ball 812 and bond pad 416A is described above, in light of this disclosure, it is understood that other electrically conductive pathways can be formed. For example, substrate 802 is a multi-layered laminated substrate and, instead of a straight-through via 808, a plurality of electrically conductive traces on various layers in substrate 802 are interconnected by a plurality of electrically conductive vias to form the electrical interconnection between trace 804 on upper surface 802U and trace 810 on lower surface 802L. As another alternative, the interconnection balls are distributed in an array format to form a ball grid array type package. Alternatively, the interconnection balls are not formed, e.g., to form a metal land array type package or, alternatively, a leadless chip carrier (LCC) package.

In one embodiment, coupon 452 is ceramic. In accordance with this embodiment, coupon 452 is not electrically connected to ground, i.e., is electrically floating. Of importance, by forming coupon 452 of ceramic, coupon 452 does not accumulate static charge. Accordingly, the prior art requirement of grounding the cap which covered the micromachine area is eliminated. More particularly, the prior art requirement of wire bonding the cap to a ground trace (see cap 42, ground trace 48, and bond wire 50 of FIG. 3 for example) is eliminated. Thus, fabrication of package 800 is less labor intensive, less complex and, consequently, less expensive than fabrication of micromachine package 40 in accordance with the prior art.

Package 800 further includes a package body 814. Package body 814 encloses, electrically isolates, and protects micromachine package 400 including micromachine chip 412, bead 450 and coupon 452. Further, package body 814 encloses, electrically isolates, and protects the plurality of bond wires including bond wire 806, the plurality of traces formed on upper surface 802U including trace 804, and upper surface 802U of substrate 802.

Package body 814 is formed around package 400, i.e., is formed around micromachine chip 412, bead 450 and coupon 452. In one embodiment, package body 814 is formed at a relatively low cost using a plastic encapsulation process. Plastic encapsulation processes are well known to those of skill in the art and are not discussed in detail to avoid detracting from the principals of the invention.

More particularly, to form package body 814, package 400 is molded in a plastic encapsulant which is injected around package 400. Of importance, the enclosure formed by coupon 452 and bead 450 has sufficient structural integrity, e.g., strength, to withstand this injection of plastic encapsulant.

In contrast, micromachine package 40 (FIG. 3) of the prior art used cap 42 formed of silicon from a silicon wafer. Disadvantageously, cap 42 lacked the structural integrity to withstand the injection of plastic encapsulant which occurs during a plastic encapsulation process. Stated another way, cap 42 would have a tendency to crack if cap 42 was encapsulated in plastic encapsulant. Accordingly, if micromachine package 40 was plastic encapsulated, an unacceptably high incidence of package failure would be observed.

Advantageously, package 800 in accordance with this embodiment is a plastic encapsulated package. Accordingly, package 800 has superior performance, e.g., resistance to shorting and environmental degradation, than micromachine package 40. Further, since package 800 is fabricated using a plastic encapsulation process, this superior performance is obtained at a relatively low cost.

Although package body 814 is described above as being formed from plastic encapsulant, in light of this disclosure, those of skill in the art will recognize that package body 814 can be formed from other materials using other well known processes. To illustrate, in one embodiment, package body 814 is formed from a liquid encapsulant. In accordance with this embodiment, a liquid encapsulant is applied to enclose package 400, the plurality of bond wires including bond wire 806, the plurality of traces formed on upper surface 802U including trace 804, and upper surface 802U of substrate 802. The liquid encapsulant is cured.

Further, although the fabrication of package 800 on an individual basis is described above, in light of this disclosure, those of skill in the art will recognize that a plurality of packages 800 can be formed simultaneously in an array format.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A method comprising:
    attaching a bead to a first surface of a coupon; and
    attaching said bead to a first surface of a first micromachine chip, wherein said bead and said coupon form an enclosure which defines a cavity above a micromachine area in said first surface of said first micromachine chip.

2. The method of claim 1 wherein a micromachine substrate comprises a plurality of micromachine chips integrally connected to one another, said plurality of micromachine chips including said first micromachine chip.

3. The method of claim 2 wherein said micromachine substrate comprises a plurality of singulation streets, said method further comprising singulating said micromachine substrate along said singulation streets.

4. The method of claim 2 further comprising validity testing said plurality of micromachine chips.

5. The method of claim 4 wherein said validity testing precedes said attaching said bead to a first surface of a first micromachine chip.

6. The method of claim 4 wherein said validity testing further comprises identifying a second micromachine chip of said plurality of micromachine chips which is defective.

7. The method of claim 6 wherein a micromachine area of said second micromachine chip is left uncovered.

8. The method of claim 1 wherein said attaching a bead to a first surface of a coupon comprises screening said bead to a perimeter of said first surface of said coupon.

9. The method of claim 1 wherein said attaching a bead to a first surface of a coupon comprises:
    screening a material to a surface of a single piece comprising a plurality of coupon integrally connected together, said plurality of coupon including said coupon; and
    singulating said single piece.

10. The method of claim 1 wherein said attaching said bead to a first surface of a first micromachine chip comprises heating said first micromachine chip.

11. The method of claim 10 wherein said attaching said bead to a first surface of a first micromachine chip further comprises heating said coupon.

12. The method of claim 11 wherein said heating said coupon causes said bead to melt.

13. The method of claim 12 wherein said attaching said bead to a first surface of a first micromachine chip further comprises contacting said first surface of said micromachine chip around a perimeter of said micromachine area with said bead.

14. The method of claim 13 further comprising solidifying said bead.

15. The method of claim 1 further comprising attaching said first micromachine chip to a first surface of a substrate; and
    electrically connecting a first bond pad of said first micromachine chip to a first electrically conductive trace on said first surface of said substrate.

16. The method of claim 15 wherein said first electrically conductive trace on said first surface of said substrate is electrically connected to a first electrically conductive trace on a second surface of said substrate opposite said first surface of said substrate.

17. The method of claim 16 wherein a first electrically conductive interconnection ball is formed on said first trace on said second surface of said substrate.

18. The method of claim 1 further comprising attaching said first micromachine chip to a substrate.

19. The method of claim 18 further comprising forming a package body around said first micromachine chip, said bead and said coupon.

20. The method of claim 19 wherein said package body is formed by injecting plastic encapsulant around said first micromachine chip, said bead and said coupon.

21. The method of claim 19 wherein said package body comprises liquid encapsulant.

22. The method of claim 1 wherein said bead comprises solder glass.

23. The method of claim 1 wherein said bead comprises epoxy.

24. The method of claim 23 wherein said attaching said bead to a first surface of a first micromachine chip precedes said attaching a bead to a first surface of a coupon.

* * * * *